United States Patent
Li et al.

(10) Patent No.: US 10,497,805 B2
(45) Date of Patent: Dec. 3, 2019

(54) SEMICONDUCTOR STRUCTURE AND MANUFACTURING METHOD OF THE SAME

(71) Applicant: UNITED MICROELECTRONICS CORP., Hsinchu (TW)

(72) Inventors: Shin-Hung Li, Caotun Township, Nantou County (TW); Kuan-Chuan Chen, Taichung (TW); Nien-Chung Li, Hsinchu (TW); Wen-Fang Lee, Hsinchu (TW); Chih-Chung Wang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/102,847

(22) Filed: Aug. 14, 2018

(65) Prior Publication Data

US 2019/0115469 A1    Apr. 18, 2019

Related U.S. Application Data

(62) Division of application No. 15/785,606, filed on Oct. 17, 2017, now Pat. No. 10,084,083.

(51) Int. Cl.
*H01L 21/324* (2006.01)
*H01L 29/78* (2006.01)
(Continued)

(52) U.S. Cl.
CPC ........... *H01L 29/7833* (2013.01); *G03F 1/36* (2013.01); *H01L 21/26513* (2013.01); *H01L 21/3086* (2013.01); *H01L 21/324* (2013.01); *H01L 21/76224* (2013.01); *H01L 27/0207* (2013.01); *H01L 27/088* (2013.01);
(Continued)

(58) Field of Classification Search
CPC ........... H01L 29/7833; H01L 21/26513; H01L 21/3086; H01L 21/324; H01L 21/76224; H01L 27/0207; H01L 27/088; H01L 29/0649; H01L 29/0847; H01L 29/36; H01L 29/42372; H01L 29/66575; H01L 29/6659; H01L 29/0843–0891;
(Continued)

(56) References Cited

U.S. PATENT DOCUMENTS

| | | |
|---|---|---|
| 7,525,150 B2 | 4/2009 | Chen et al. |
| 2004/0152244 A1* | 8/2004 | Yamamoto ........ H01L 21/76213 438/142 |

(Continued)

*Primary Examiner* — Shahed Ahmed
(74) *Attorney, Agent, or Firm* — WPAT, PC

(57) ABSTRACT

A semiconductor structure and a manufacturing method of a semiconductor structure are provided. The semiconductor structure includes a semiconductor substrate, a gate, a first diffusion region and a second diffusion region. The gate is disposed on the semiconductor substrate and extends along a first direction. The first diffusion region is formed in the semiconductor substrate, and the second diffusion region is formed in the first diffusion region. The first diffusion region has a first portion located underneath the gate and a second portion protruded from a lateral side of the gate, the first portion has a first length parallel to the first direction, the second portion has a second length parallel to the first direction, and the first length is larger than the second length.

10 Claims, 8 Drawing Sheets

(51) Int. Cl.
*H01L 29/423* (2006.01)
*H01L 29/08* (2006.01)
*H01L 29/36* (2006.01)
*H01L 29/06* (2006.01)
*H01L 27/02* (2006.01)
*G03F 1/36* (2012.01)
*H01L 21/308* (2006.01)
*H01L 21/265* (2006.01)
*H01L 21/762* (2006.01)
*H01L 27/088* (2006.01)
*H01L 29/66* (2006.01)

(52) U.S. Cl.
CPC ...... *H01L 29/0649* (2013.01); *H01L 29/0847* (2013.01); *H01L 29/36* (2013.01); *H01L 29/42372* (2013.01); *H01L 29/66575* (2013.01)

(58) Field of Classification Search
CPC .................. H01L 29/66636–66643; H01L 21/823418–823425; H01L 21/823814
See application file for complete search history.

(56) References Cited

U.S. PATENT DOCUMENTS

| | | | |
|---|---|---|---|
| 2005/0186744 A1* | 8/2005 | Abadeer ........... | H01L 21/28114 438/291 |
| 2011/0303984 A1* | 12/2011 | Chen ............... | H01L 21/823456 257/369 |
| 2012/0313151 A1* | 12/2012 | Lee .................. | H01L 21/28518 257/288 |
| 2014/0084385 A1* | 3/2014 | Hoffmann .......... | H01L 29/7833 257/402 |
| 2016/0043188 A1* | 2/2016 | Chu ................... | H01L 27/124 257/72 |
| 2018/0012970 A1* | 1/2018 | Kim .................. | H01L 29/66575 |

\* cited by examiner

US 10,497,805 B2

SEMICONDUCTOR STRUCTURE AND MANUFACTURING METHOD OF THE SAME

This application is a divisional application of U.S. application Ser. No. 15/785,606, filed on Oct. 17, 2017. The entire content of the related application is incorporated herein by reference.

BACKGROUND

Technical Field

The present disclosure relates in general to a semiconductor structure and a manufacturing method thereof, and more particularly to a semiconductor structure with double diffused drains (DDD) and a manufacturing method thereof.

Description of the Related Art

With the developments of semiconductor technology, in addition to high voltage devices, medium voltage devices are widely applied to a variety of electronic products in different fields as well. For example, applications of medium voltage devices include I/O, DAC, OPT, MTP, and etc., and the occupied area of medium voltage devices in the overall device may be up to 20% to 50%. While a double diffused drain (DDD) usually provides a higher breakdown voltage, a DDDMOS device may be included in the applications of medium voltage devices as well. Therefore, researches and developments in the designs of applying such devices in the applications of medium voltage devices have been disclosed.

SUMMARY OF THE INVENTION

The present disclosure is directed to a semiconductor structure and a manufacturing method thereof. According to the embodiments of the present disclosure, the first length of the first portion of the first diffusion region located under the gate is larger than the second length of the second portion of the first diffusion region protruded from a lateral side of the gate, such that the design rule of the first diffusion region under the channel region can be maintained for the desired electrical performance (i.e. Vt stability, desired on-resistance, and etc.), and the total area of the first diffusion region can be reduced for further reducing the device size.

According to an embodiment of the present disclosure, a semiconductor structure is disclosed. The semiconductor structure includes a semiconductor substrate, a gate, a first diffusion region and a second diffusion region. The gate is disposed on the semiconductor substrate and extends along a first direction. The first diffusion region is formed in the semiconductor substrate, and the second diffusion region is formed in the first diffusion region. The first diffusion region has a first portion located underneath the gate and a second portion protruded from a lateral side of the gate, the first portion has a first length parallel to the first direction, the second portion has a second length parallel to the first direction, and the first length is larger than the second length.

According to another embodiment of the present disclosure, a manufacturing method of a semiconductor structure is disclosed. The manufacturing method of the semiconductor structure includes the following steps: providing a semiconductor substrate; providing a photomask having a layout pattern; forming a first diffusion region in the semiconductor substrate according to the layout pattern, wherein the first diffusion region has a first portion and a second portion connected to each other, the first portion has a first length parallel to a first direction, the second portion has a second length parallel to the first direction, and the first length is larger than the second length; forming a gate on the semiconductor substrate, wherein the gate extends along the first direction, the first portion of the first diffusion region is located underneath the gate, and the second portion of the first diffusion region is protruded from a lateral side of the gate; and forming a second diffusion region in the first diffusion region.

The disclosure will become apparent from the following detailed description of the preferred but non-limiting embodiments. The following description is made with reference to the accompanying drawings.

BRIEF DESCRIPTION OF THE DRAWINGS

FIG. 10 shows a cross-sectional view along the cross-sectional line 1C-1C' in FIG. 1A;

DETAILED DESCRIPTION OF THE INVENTION

Figure 1A:
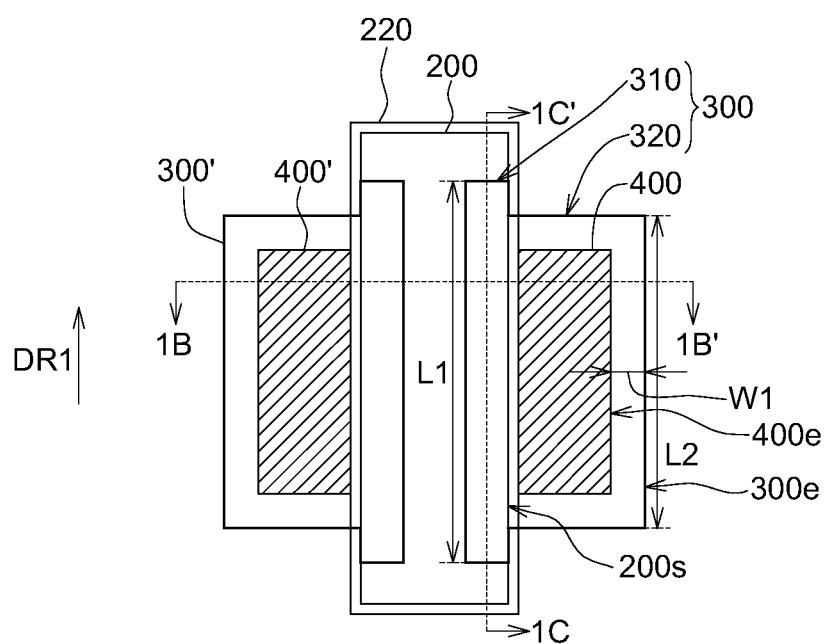
FIG. 1A shows a top view of a semiconductor structure according to an embodiment of the present disclosure.

According to the embodiments of the present disclosure, a semiconductor structure and a manufacturing method thereof are provided. The embodiments are described in details with reference to the accompanying drawings. The details of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regarded as an illustrative sense rather than a restrictive sense. It is to be noted that the drawings are simplified for clearly describing the embodiments, and the details of the structures and the manufacturing processing steps of the embodiments are for exemplification only, not for limiting the scope of protection of the disclosure. Ones having ordinary skills in the art may modify or change the structures and the manufacturing processing steps according to the embodiments of the present disclosure.

Figure 1B:
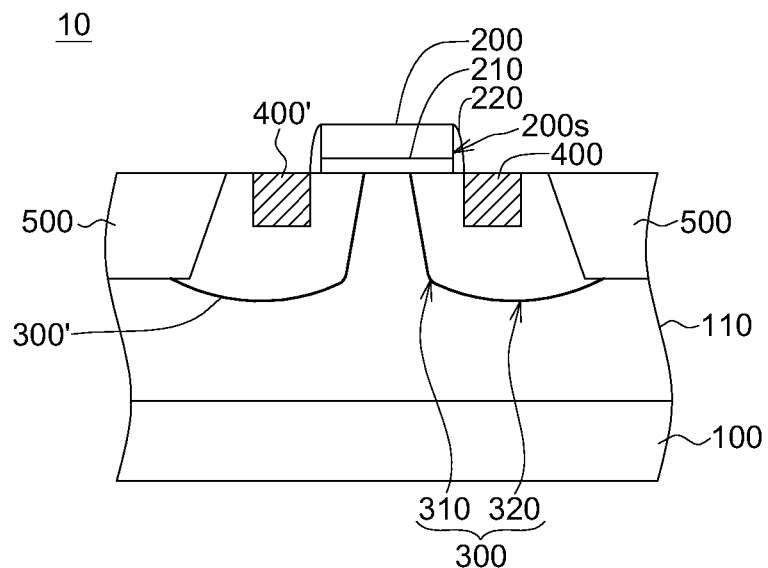
FIG. 1B shows a cross-sectional view along the cross-sectional line 1B-1B' in FIG. 1A.

FIG. 1A shows a top view of a semiconductor structure according to an embodiment of the present disclosure, FIG. 1B shows a cross-sectional view along the cross-sectional line 1B-1B' in FIG. 1A, and FIG. 10 shows a cross-sectional view along the cross-sectional line 1C-1C' in FIG. 1A.

Figure 1C:
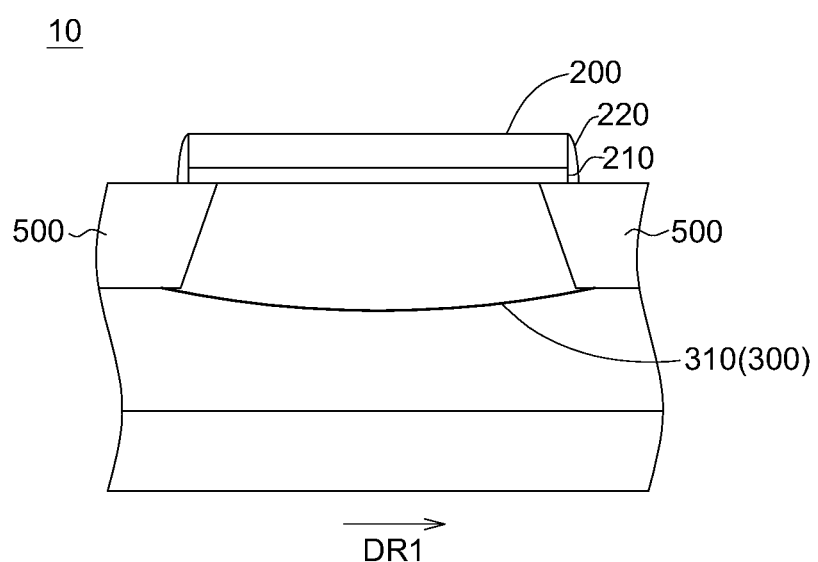

As shown in FIGS. 1A-1C, the semiconductor structure 10 includes a semiconductor substrate 100, a gate 200, a first diffusion region 300 and a second diffusion region 400. The gate 200 is disposed on the semiconductor substrate 100 and extends along a first direction DR1. The first diffusion region 300 is formed in the semiconductor substrate 100, and the second diffusion region 400 is formed in the first diffusion region 300. The first diffusion region 300 has a first portion 310 located underneath the gate 200 and a second portion 320 protruded from a lateral side 200s of the gate 200, the first portion 310 has a first length L1 parallel to the first direction DR1, the second portion 320 has a second length L2 parallel to the first direction DR1, and the first length L1 is larger than the second length L2.

As shown in FIG. 1A, in the embodiments, the first length L1 is larger than the second length L2 by at least 15 nm.

As shown in FIG. 1A, the first portion 310 and the second portion 320 of the first diffusion region 300 form a T-shaped pattern.

In the embodiments, as shown in FIG. 1A and FIG. 1B, the second diffusion region 400 is formed in the second portion 320 of the first diffusion region 300, and the second diffusion region 400 has a higher dopant concentration than the first diffusion region 300.

As shown in FIGS. 1B and 1C, the semiconductor structure 10 may further include a shallow trench isolation (STI) 500, and the shallow trench isolation 500 is formed in the semiconductor substrate 100 defining the first diffusion region 300. That is, in the structure as shown in FIGS. 1A-1C, the shallow trench isolation 500 (not shown in FIG. 1A) abuts the outer edges of the first portion 310 and the second portion 320 of the first diffusion region 300.

In the embodiments, as shown in FIG. 1A, the outer edge 300e of the first diffusion region 300 is separated from the outer edge 400e of the second diffusion region 400 by a distance W1. When the T-shaped pattern of the first diffusion region 300 including the first portion 310 having the first length L1 and the second portion 320 having the second length L2 is designed, the first length L1 is determined according to the desired electrical performance to be achieved, and then the second length L2 is determined by subtracting the first length L1 by the distance W1. As such, the distance W1 may be regarded as the reduced extent of the second portion 320 of the first diffusion region 300.

In some embodiments, the distance W1 may be 9 nm to 17 nm; in other embodiments, the distance W1 may vary according to actual needs and is not limited thereto.

In some embodiments, as shown in FIG. 1A and FIG. 1B, the semiconductor structure 10 further include another first diffusion region 300' and another second diffusion region 400' formed in the semiconductor substrate 100, the second diffusion region 400' is formed in the first diffusion region 300', the first diffusion regions 300 and 300' are located on two opposite sides of the gate 200, and the second diffusion regions 400 and 400' are located on two opposite sides of the gate 200. As shown in FIG. 1A and FIG. 1B, the first diffusion region 300' may have the same T-shaped pattern as that of the first diffusion region 300.

As shown in FIG. 1B and FIG. 1C, the semiconductor structure 10 may further include an oxide layer 210 and a spacer 220, the oxide layer 210 is formed between the semiconductor substrate 100 and the gate 200, and the spacer 220 is formed on the sidewall of the gate 200.

As shown in FIG. 1B and FIG. 1C, the semiconductor structure 10 may further include a lightly-doped region 110 formed in the semiconductor substrate 100, and the lightly-doped region 110 encompasses the first diffusion regions 300 and 300' and the second diffusion regions 400 and 400'.

In the embodiments, the second diffusion regions 400 and 400' are such as drain/source regions, the first diffusion regions 300 and 300' surround the drain/source regions, and the semiconductor structure 10 is such as a double diffused drains (DDD) MOS device.

In DDDMOS devices, for example, medium voltage (MV) DDDMOS devices, the design rule of the diffusion region under the gate (e.g. channel region) is important to the electrical performance of the MV DDDMOS device, such as stability of threshold voltage (Vt), the prevention of undesired junction breakdown and the desired value of on-resistance. According to the embodiments of the present disclosure, the first length L1 of the first portion 310 of the first diffusion region 300 is larger than the second length L2 of the second portion 320 of the first diffusion region 300, such that the design rule of the first diffusion region 300 under the channel region can be maintained for the desired electrical performance (i.e. Vt stability, desired on-resistance, and etc.), and the total area of the first diffusion region 300 can be reduced for further reducing the device size.

Table 1 below shows breakdown voltages of semiconductor structures with the second portions 320 of the first diffusion regions 300 having different occupied areas according to some embodiments of the present disclosure. While the area of the second diffusion region 400 remains constant, the different occupied areas of the second portions 320 are represented by the different values of the distance W1.

TABLE 1

|  | Embodiment 1-1 | Embodiment 1-2 | Embodiment 1-3 | Embodiment 1-4 | Embodiment 1-5 |
| --- | --- | --- | --- | --- | --- |
| Distance W1 (nm) | 17 | 15 | 13 | 11 | 9 |
| Breakdown voltage (V) | 13.6 | 13.5 | 13.3 | 12.9 | 12.6 |

As shown in table 1, as the width W1 varies from 17 nm to 9 nm, indicating the occupied area of the second portion 320 being greatly reduced, the breakdown voltage is only slightly decreased from 13.6V to 12.6V. As such, with the design of the first portion 310 and the second portion 320 of the first diffusion region 300 according to the embodiments of the present disclosure, the desired electrical performance (i.e. Vt stability, desired on-resistance, and etc.) can be maintained, and the breakdown voltages is only slightly influenced yet still remained in the range of the operation voltage of medium voltage devices.

Figure 2A:
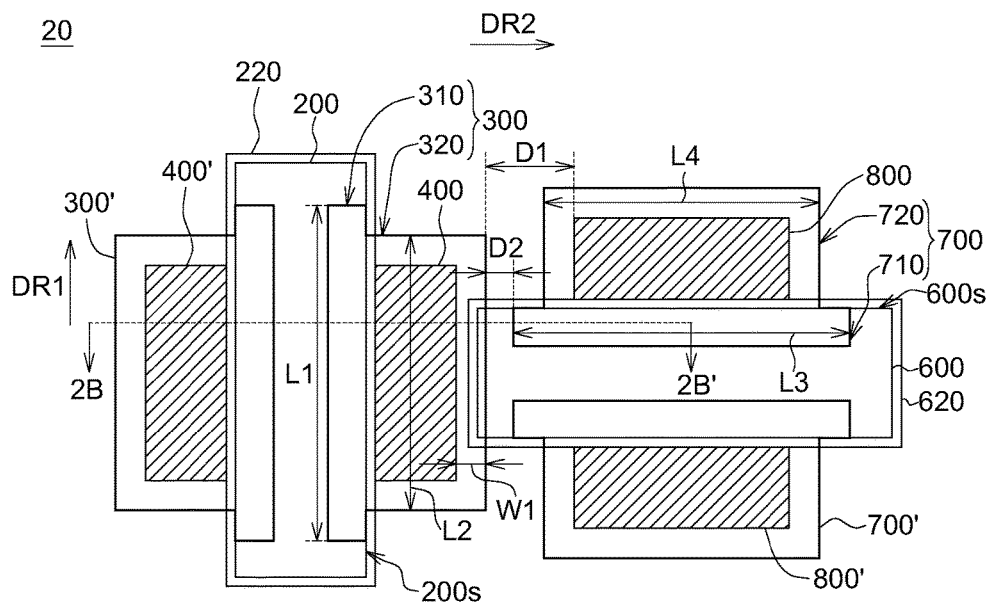
FIG. 2A shows a top view of a semiconductor structure according to another embodiment of the present disclosure.
Figure 2B:
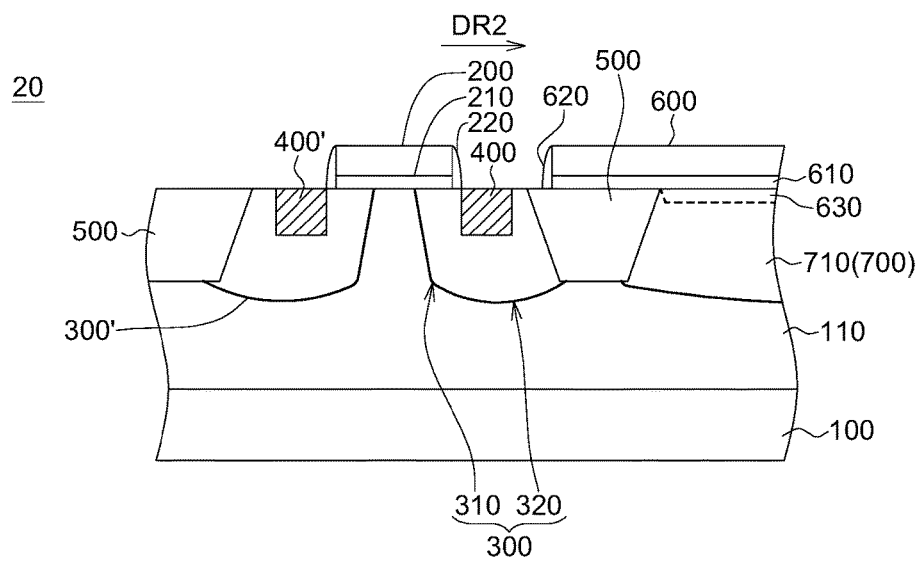
FIG. 2B shows a cross-sectional view along the cross-sectional line 2B-2B' in FIG. 2A.

FIG. 2A shows a top view of a semiconductor structure according to another embodiment of the present disclosure, and FIG. 2B shows a cross-sectional view along the cross-sectional line 2B-2B' in FIG. 2A. The elements in the present embodiment sharing similar or the same labels with those in the previous embodiment are similar or the same elements, and the description of which is omitted.

As shown in FIG. 2A and FIG. 2B, the semiconductor structure 20 may further include an additional gate 600, an additional first diffusion region 700 and an additional second diffusion region 800. The additional gate 600 is disposed on the semiconductor substrate 100 and extends along a second direction DR2 which is perpendicular to the first direction DR1. The additional first diffusion region 700 is formed in the semiconductor substrate 100. The additional second diffusion region 800 is formed in the additional first diffusion region 700 and separated from the first diffusion region 300 by a predetermined minimum distance D1.

As shown in FIG. 2A and FIG. 2B, the semiconductor structure 20 includes two MOS devices arranged vertically to each other; that is, the extending direction of the gate 200 and the extending direction of the additional gate 600 are perpendicular to each other. In the embodiments, as shown in FIG. 2B, the shallow trench isolation 500 is formed in the semiconductor substrate 100 defining the first diffusion region 300, and the shallow trench isolation 500 may define the additional first diffusion region 700 as well. That is, in the structure as shown in FIGS. 2A-2B, the shallow trench isolation 500 (not shown in FIG. 2A) abuts the outer edges of the first portion 310 and the second portion 320 of the first diffusion region 300, and the shallow trench isolation 500 may also abut the outer edges of the additional first diffusion region 700. As shown in FIG. 2A and FIG. 2B, while the diffusion regions are all formed before the formation of the gate 200 and the additional gate 600, the predetermined minimum distance D1 provides the variation tolerance for the implantation processes of the diffusion regions, such that the first diffusion region 300 of one MOS device does not overlap the channel region 630 of another MOS device, and thus short circuit can be effectively prevented.

In some embodiments, the predetermined minimum distance D1 may be at least 50 nm; in other embodiments, the predetermined minimum distance D1 may be less than 50 nm or larger than 50 nm. The predetermined minimum distance D1 is determined basically according to the limitations and variation tolerance of the manufacturing processes and thus may vary according to actual situations.

As shown in FIG. 2A, as the pitch size of the semiconductor structure 20 including multiple MOS devices are determined by the distance between adjacent MOS devices, which is determined from the predetermined minimum distance D1, the distance W1 and the second length L2, it is clear that with the design of the first diffusion region 300 according to the embodiments of the present disclosure, the pitch size of the semiconductor structure 20 can be effectively reduced.

Table 2 below shows size parameters of semiconductor structures according to some embodiments and a comparative embodiment of the present disclosure. In table 2, "Voltage" refers to the operation voltage, "D2D rule" refers to the distance between the second diffusion region 400 and the additional second diffusion region 800 (i.e. the distance between drains of adjacent MOS devices), "L pitch" refers to the distance between the second diffusion region 400 and another second diffusion region of another MOS device (not shown in drawings) along the first direction DR1, "W pitch" refers to the distance between the second diffusion region 400 and the additional second diffusion region 800, and "Area" refers to the area calculated by "L pitch" multiplied by "W pitch". In the structure of comparative embodiment 1, the diffusion regions for the drains do not have the structural design of the first diffusion region 300 according to the embodiments of the present disclosure.

TABLE 2

| | Voltage (V) | D2D rule (μm) | L pitch (μm) | W pitch (μm) | Area (μm²) | Reduced area (%) |
|---|---|---|---|---|---|---|
| Comparative embodiment 1 | 8 | 0.230 | 1.429 | 0.480 | 0.686 | 0 |
| Embodiment 2-1 | 8 | 0.212 | 1.411 | 0.462 | 0.653 | 5.2 |
| Embodiment 2-2 | 6 | 0.212 | 1.177 | 0.462 | 0.544 | 5.4 |
| Embodiment 2-3 | 3.3 | 0.212 | 1.078 | 0.462 | 0.498 | 5.6 |

As shown in table 2, the structure of the embodiment 2-1 has a first diffusion region 300 with the first length L1 larger than the second length L2 by 18 nm, and while the operation voltages for comparative embodiment 1 and embodiment 2-1 are the same, the pitch area of the structure of embodiment 2-1 is reduced by 5.2%. Similarly, with the design of the first diffusion region 300 according to the embodiments of the present disclosure, the devices can function well under medium operation voltages with reduced device sizes.

As shown in FIGS. 2A and 2B, the semiconductor structure 20 may further include an oxide layer 610 and a spacer 620, the oxide layer 610 is formed between the semiconductor substrate 100 and the additional gate 600, and the spacer 620 is formed on the sidewall of the additional gate 600.

In some embodiments, as shown in FIG. 2A and FIG. 2B, a portion of the additional gate 600 may be located on the first diffusion region 300.

In the embodiments, as shown in FIG. 2A and FIG. 2B, the first diffusion region 300 and the additional first diffusion region 700 are separated from each other by a distance D2. In some other embodiments, the first diffusion region 300 and the additional first diffusion region 700 may be overlapped (not shown in drawings).

In the embodiments, the additional first diffusion region 700 may have a T-shaped pattern similar to that of the first diffusion region 300. For example, as shown in FIG. 2A, the additional first diffusion region 700 may have a third portion 710 and a fourth portion 720, the third portion 710 is located underneath the additional gate 600, the fourth portion 720 is protruded from a lateral side 600s of the additional gate 600, the third portion 710 has a third length L3 parallel to the second direction DR2, the fourth portion 720 has a fourth length L4 parallel to the second direction DR2, and the third length L3 is larger than the fourth length L4.

As shown in FIG. 2A and FIG. 2B, the semiconductor structure 20 further include another additional first diffusion region 700' and another additional second diffusion region 800' formed in the semiconductor substrate 100, the additional second diffusion region 800' is formed in the additional first diffusion region 700', the additional first diffusion regions 700 and 700' are located on two opposite sides of the additional gate 600, and the additional second diffusion regions 800 and 800' are located on two opposite sides of the additional gate 600. As shown in FIG. 2A and FIG. 2B, the additional first diffusion region 700' may have the same T-shaped pattern as that of the additional first diffusion region 700.

FIG. 3A to FIG. 9 show a manufacturing method of a semiconductor structure according to an embodiment of the present disclosure. The elements in the present embodiment sharing similar or the same labels with those in the previous embodiments are similar or the same elements, and the description of which is omitted.

Figure 3A:
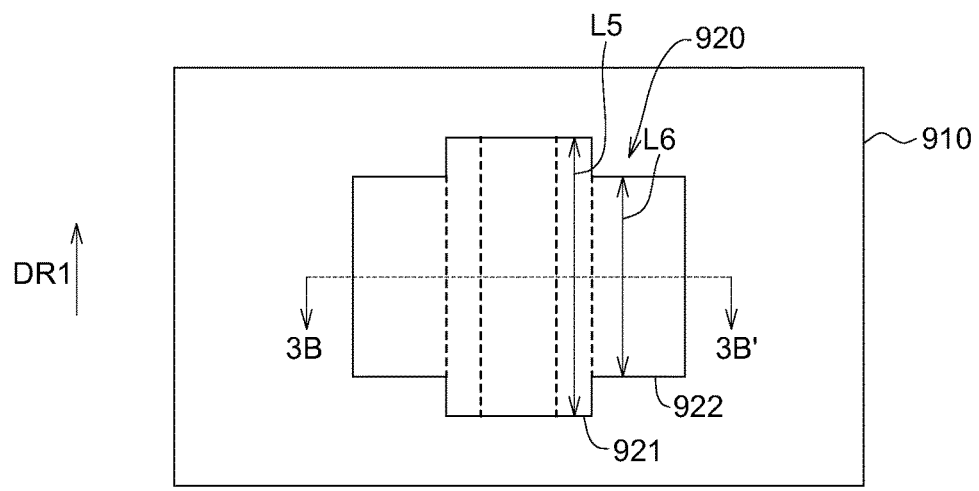
FIG. 3A to FIG. 9 show a manufacturing method of a semiconductor structure according to an embodiment of the present disclosure.
Figure 3B:
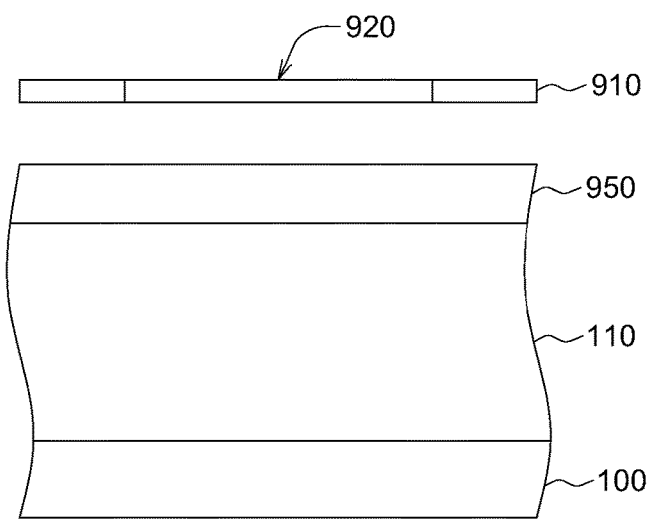

Referring to FIG. 3A and FIG. 3B (FIG. 3A shows a top view of the present step, and FIG. 3B shows a cross-sectional view along the cross-sectional line 3B-3B' in FIG. 3A), a semiconductor substrate 100 is provided, and a photomask 910 having a layout pattern 920 is provided.

As shown in FIG. 3A, the layout pattern 920 has a first pattern 921 and a second pattern 922 connected to each other, the first pattern 921 has a first pattern length L5 parallel to the first direction DR1, the second pattern 922 has a second pattern length L6 parallel to the first direction DR1, and the first pattern length L5 is larger than the second pattern length L6. As shown in FIG. 3A, the first pattern 921 and the second pattern 922 of the layout pattern 920 form a T-shaped pattern.

In the embodiments, an optical proximity correction process may be further performed for the layout pattern 920.

As shown in FIG. 3B, a lightly-doped region 110 is formed in the semiconductor substrate 100, and a mask layer 950 is formed on the semiconductor substrate 100.

Figure 4A:
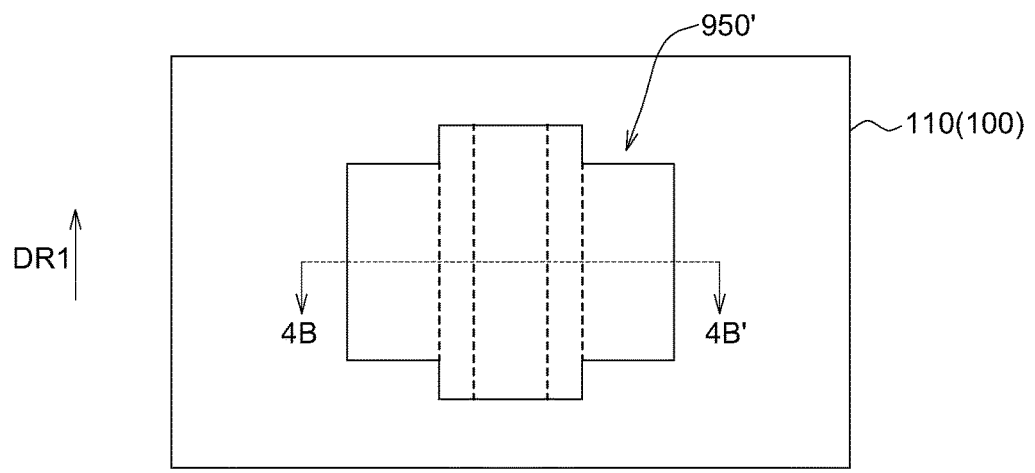
Figure 4B:
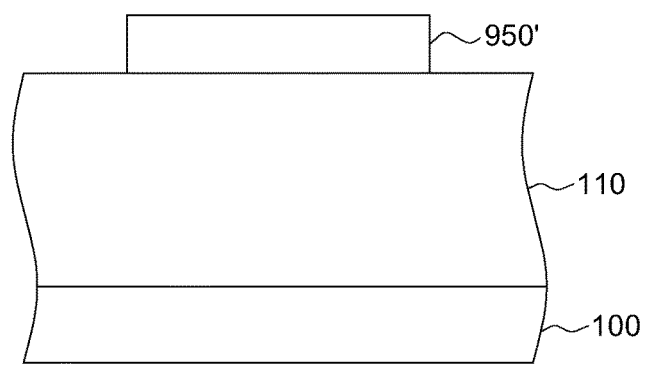

Referring to FIG. 4A and FIG. 4B (FIG. 4A shows a top view of the present step, and FIG. 4B shows a cross-sectional view along the cross-sectional line 4B-4B' in FIG. 4A), the layout pattern 920 is transferred from the photomask 910 to the mask layer 950 to form a patterned mask layer 950' having the transferred layout pattern.

Figure 5A:
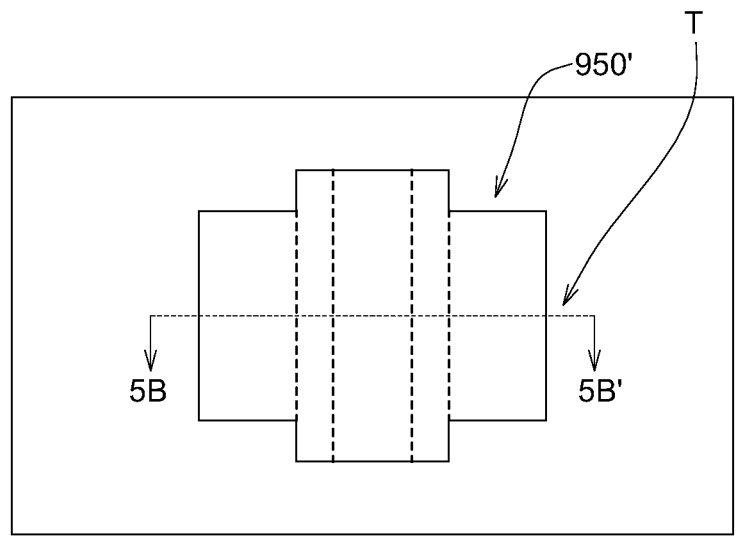
Figure 5B:
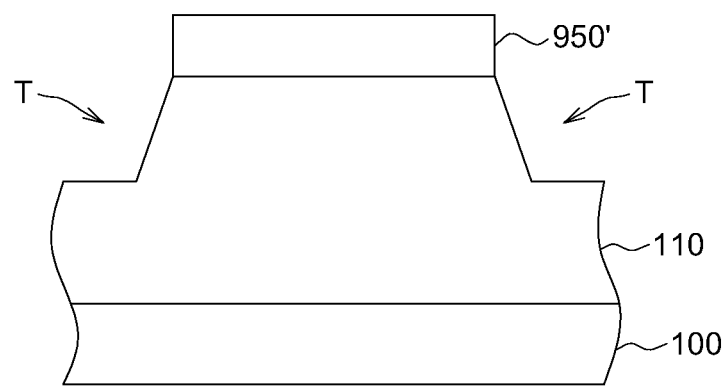

Next, referring to FIG. 5A and FIG. 5B (FIG. 5A shows a top view of the present step, and FIG. 5B shows a cross-sectional view along the cross-sectional line 5B-5B' in FIG. 5A), a plurality of trenches T are formed in the semiconductor substrate 100 by etching the semiconductor substrate 100 according to the patterned mask layer 950' having the transferred layout pattern.

Figure 6:
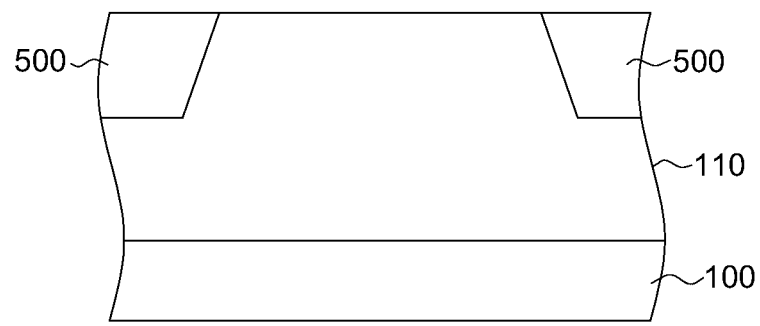

Next, referring to FIG. 6, an insulating material is filled in the trenches T to form a shallow trench isolation 500 in the semiconductor structure 100.

Figure 7:
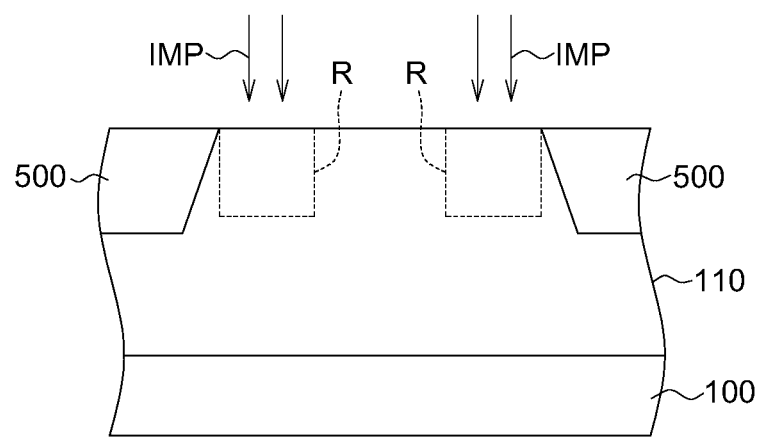
Figure 8:
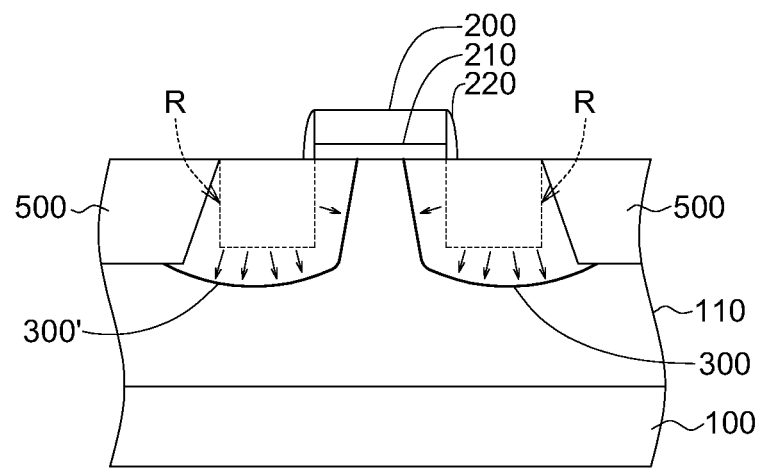
Figure 9:
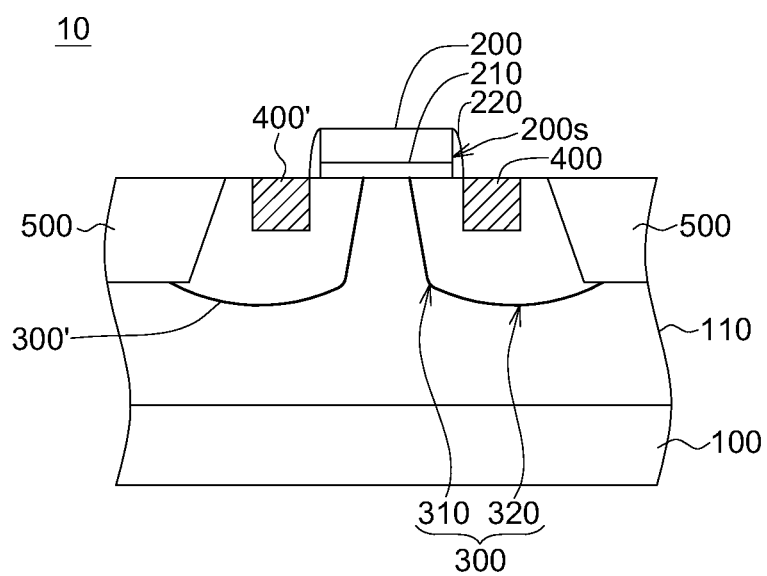

Next, referring to FIG. 7 to FIG. 8, a first diffusion region 300 is formed in the semiconductor substrate 100 according to the layout pattern 920. The process for forming the first diffusion region 300 may include the following steps.

As shown in FIG. 7, an implantation process IMP is performed on a region R of the semiconductor substrate 100 enclosed by the shallow trench isolation 500. It is to be noted that in the present implantation process, the region R with dopants is smaller than the first diffusion region 300 to-be-formed, and the formation of the first diffusion region 300 will be completed after at least a thermal process is performed on the region R subsequently, as described hereinafter.

Next, as shown in FIG. 8, after at least a thermal process is performed on the region R, the dopants in the region R is driven by the thermal process to diffuse, the doped region is thus enlarged, and then the region R with dopants is expanded until stopped by the shallow trench isolation 500, thereby the first diffusion region 300 is formed.

As shown in FIG. 8, an oxide layer 210 is formed on the semiconductor substrate 100. In the embodiments, the process of forming the oxide layer 210 requires heating, and the aforementioned thermal process for forming the first diffusion region 300 may be realized by the process of forming the oxide layer 210. That is, as the oxide layer 210 is formed on the semiconductor substrate 100 at an elevated temperature, this thermal process facilitates the expansion of the region R with dopants for forming the first diffusion region 300. In the embodiments, in addition to the process of forming the oxide layer 210, there may be other processes requiring heating performed before the step of forming the gate 200 on the semiconductor substrate 100, and these thermal processes may be included in the aforementioned thermal process for forming the first diffusion region 300.

As shown in FIG. 8, after the first diffusion region 300 is formed in the semiconductor substrate 100, the gate 200 is formed on the semiconductor substrate 100.

Next, referring to FIGS. 1A-1C and FIG. 9, the second diffusion region 400 is formed in the first diffusion region 300 by such as an implantation process. As shown in FIGS. 1A-1C and FIG. 9, in the as-formed semiconductor structure 10, the first diffusion region 300 has a first portion 310 located underneath the gate 200 and a second portion 320 protruded from a lateral side 200s of the gate 200, the first portion 310 has a first length L1 parallel to the first direction DR1, the second portion 320 has a second length L2 parallel to the first direction DR1, and the first length L1 is larger than the second length L2.

Table 3 below shows some processing deviations in selected steps in the manufacturing process according to some embodiments of the present disclosure, and the aforementioned predetermined minimum distance D1 may be determined according to these parameters. In table 3, "CD bar" refers to the critical dimension bar in the step of transferring a layout pattern from a photomask to a mask layer, "AA" refers to the processing deviation in the step of forming trenches according to the mask with the transferred layout pattern, and "Spec limited" refers to the minimum deviation tolerance of the predetermined minimum distance D1 determined according to "CD bar" and "AA". The units are all in "nm". In embodiment 3-1, the first diffusion region 300 is N-type doped, and in embodiment 3-2, the first diffusion region 300 is P-type doped.

TABLE 3

|  | CD bar | CD 3σ | AA | AA 3σ | Spec limited |
| --- | --- | --- | --- | --- | --- |
| Embodiment 3-1 | 162 ± 16 | 7.6 | ±25 | 17 | 41 |
| Embodiment 3-2 | 162 ± 16 | 11.1 | ±25 | 15 | 41 |

According to the results as shown in table 3, the predetermined minimum distance D1 is determined to be larger than the value as shown in "Spec limited"; that is, when designing the layout pattern, in the present embodiments for example, a predetermined minimum distance D1 of at least larger than 41 nm should be included in the consideration and design of the shape and size of the layout pattern. It is to be noted that table 3 shows an example of how the predetermined minimum distance D1 may be determined; however, the present disclosure is not limited thereto.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:
    providing a semiconductor substrate;
    providing a photomask having a layout pattern;
    forming a first diffusion region in the semiconductor substrate according to the layout pattern, wherein the first diffusion region has a first portion and a second portion connected to each other, the first portion has a first length parallel to a first direction, the second portion has a second length parallel to the first direction, and the first length is larger than the second length;
    forming a gate on the semiconductor substrate, wherein the gate extends along the first direction, the first portion of the first diffusion region is located underneath the gate, and the second portion of the first diffusion region is protruded from a lateral side of the gate; and
    forming a second diffusion region in the first diffusion region.

2. The manufacturing method of the semiconductor structure according to claim 1, wherein the first length is larger than the second length by at least 15 nm.

3. The manufacturing method of the semiconductor structure according to claim 1, wherein the first portion and the second portion of the first diffusion region form a T-shaped pattern.

4. The manufacturing method of the semiconductor structure according to claim 1, wherein forming the gate on the semiconductor substrate is after forming the first diffusion region in the semiconductor substrate.

5. The manufacturing method of the semiconductor structure according to claim 1, wherein the second diffusion region has a higher dopant concentration than the first diffusion region.

6. The manufacturing method of the semiconductor structure according to claim 1, further comprising:
   forming a mask layer on the semiconductor substrate;
   transferring the layout pattern from the photomask to the mask layer; and
   forming a plurality of trenches in the semiconductor substrate by etching the semiconductor substrate according to the mask layer having the transferred layout pattern; and
   filling an insulating material in the trenches to form a shallow trench isolation in the semiconductor structure.

7. The manufacturing method of the semiconductor structure according to claim 6, wherein forming the first diffusion region in the semiconductor substrate further comprising:
   performing an implantation process on a region of the semiconductor substrate enclosed by the shallow trench isolation; and
   performing a thermal process on the region.

8. The manufacturing method of the semiconductor structure according to claim 1, wherein the layout pattern has a first pattern and a second pattern connected to each other, the first pattern has a first pattern length parallel to the first direction, the second pattern has a second pattern length parallel to the first direction, and the first pattern length is larger than the second pattern length.

9. The manufacturing method of the semiconductor structure according to claim 8, wherein the first pattern and the second pattern of the layout pattern form a T-shaped pattern.

10. The manufacturing method of the semiconductor structure according to claim 1, further comprising:
    performing an optical proximity correction process for the layout pattern.

* * * * *